United States Patent [19]

Matsui

[11] Patent Number: 5,384,952
[45] Date of Patent: Jan. 31, 1995

[54] METHOD OF CONNECTING AN INTEGRATED CIRCUIT CHIP TO A SUBSTRATE

[75] Inventor: Koji Matsui, Tokyo, Japan

[73] Assignee: NEC Corporation, Tokyo, Japan

[21] Appl. No.: 814,115

[22] Filed: Dec. 26, 1991

[30] Foreign Application Priority Data

Dec. 26, 1990 [JP] Japan .................. 2-414289

[51] Int. Cl.6 ............................................. H04K 3/34
[52] U.S. Cl. ...................................... 29/840; 29/830; 156/273.5
[58] Field of Search ......................... 29/840, 830, 852; 774/260; 228/124; 156/273.3, 273.5, 275.3, 275.5, 275.7

[56] References Cited

U.S. PATENT DOCUMENTS

| 4,654,752 | 3/1987 | Kyle | 29/840 X |
| 4,667,401 | 5/1987 | Clements et al. | 29/840 X |
| 4,857,671 | 8/1989 | Nakano et al. | 29/840 X |
| 4,928,387 | 5/1990 | Mather et al. | 29/840 |
| 4,955,132 | 9/1990 | Ogawa | 29/840 |
| 5,068,714 | 11/1991 | Seipler | |
| 5,086,558 | 2/1992 | Grube et al. | 29/840 X |

OTHER PUBLICATIONS

Jones, H. C., Long, D. T., "Plug and Socket Chip Joining," IBM Technical Disclosure Bulletin, vol. 26, No. 3A, Aug. 1983.

Primary Examiner—Carl J. Arbes
Attorney, Agent, or Firm—Ostrolenk, Faber, Gerb & Soffen

[57] ABSTRACT

A method of connecting an integrated circuit chip to a wiring substrate having a wiring pattern formed thereon. The method is intended to make a connection between fine connecting portions on the substrate and connecting pads on the chip easy and reliable. The connecting method includes connecting a plurality of connecting portions formed on a major surface of a wiring substrate to a plurality of connecting pads formed on a major surface of an integrated circuit chip through metal bumps and adhering portions of the major surface of the wiring substrate which have no connecting portions to portions of the major surface of the integrated circuit chip which have no connecting pads by means of a photothermosetting resin film selectively opened at the connecting portions.

10 Claims, 5 Drawing Sheets

FIG. (b)

METHOD OF CONNECTING AN INTEGRATED CIRCUIT CHIP TO A SUBSTRATE

FIELD OF THE INVENTION

The present invention relates to a connecting method for connecting an integrated circuit (IC) chip to a substrate having a wiring pattern formed thereon. The substrate may be a printed circuit board, a semiconductor wafer or a substrate for a liquid crystal display panel which may be of glass or quartz. The IC chip may be a wafer itself in which an electric circuit is formed.

DESCRIPTION OF THE PRIOR ART

An example of a conventional connecting method will be described with reference to FIGS. 1a and 1b which show the steps of the connecting method for connecting an integrated circuit (IC) chip to a substrate. In these figures, an LSI chip 1 has connecting pads 2 on which metal bumps 5 are formed, respectively, and a substrate 3 has terminals 4 which are formed correspondingly in position to the metal bumps 5 on the LSI chip 1. Those terminals 4 are connecting portions of a wiring pattern (not shown) formed on the substrate 3. The LSI chip 1 and the substrate 3 are faced through a thermo-adhesive resin film 6 containing uniformly dispersed electrically conductive particles 7, with the metal bumps 5 on the LSI chip 1 being registered with the terminals 4 on the substrate 3, respectively, as shown in FIG. 1a. Then, as shown in FIG. 1b, the LSI chip 1 is pressed to the substrate 3 while being heated. With this heating, the thermo-adhesive resin film 6 is softened and connects the metal bumps 5 to the terminals 4, respectively, by means of the electrically conductive particles 7 contained therein.

By a subsequent cooling of these members, the thermo-adhesive resin film 6 is hardened while keeping this connection between the bumps 5 and the terminals 4, so that the chip 1 and the substrate 3 are fixedly connected.

In the conventional connecting method mentioned above, there is a problem of short-circuit or current leakage between adjacent bumps 5 and/or adjacent terminals 4 when an amount of conductive particles 7 dispersed in the resin film 6 forms a connection path between adjacent ones of the bumps 5 and/or the terminals 4. If, in order to avoid such problem, the amount of the conductive particles 7 in the resin film 6 is reduced, resistance between facing bumps 5 and terminals 4 which are to be connected is increased and may not be uniform and, in the worst case, there may be connecting portions produced which are electrically opened. This tendency occurs more frequently due to a recent reduction of the size of the connecting portions. Further, it is very difficult to press adhering surfaces of the chip and the substrate while keeping them exactly parallel. If such parallelism is broken, gaps between the bumps 5 and the respective terminals 4 may vary, making the connection therebetween unstable. These problems are sources of malfunction of the device concerned.

SUMMARY OF THE INVENTION

The present invention relates to a connecting method for connecting an integrated circuit chip or a semiconductor wafer manufactured as an IC or LSI to a wiring substrate having a wiring pattern formed thereon, such as a printed circuit board, a substrate which may be a semiconductor wafer having a wiring formed thereon or a substrate of a liquid crystal display panel. An electrical connection is made between connecting pads formed on a major surface of an integrated circuit chip and connecting portions of a wiring formed on a major surface of the wiring substrate, through metal bumps. A mechanical adhesion between the chip and the wiring substrate is performed between a portion of the major surface of the chip on which the connecting pads are not formed and a portion of the major surface of the wiring substrate on which the connecting portions are not formed, by means of photothermosetting resin.

The connecting method according to the present invention comprises the steps of connecting a plurality of connecting portions formed on a major surface of a wiring substrate to a plurality of connecting pads formed on a major surface of an integrated circuit chip through metal bumps and bonding the major surface of the wiring substrate to the major surface of the integrated circuit chip through a photothermosetting resin or a photothermosetting resin film having openings selectively formed correspondingly, in position, to the respective connecting portions.

With this invention, it is possible to connect fine connecting portions to the connecting pads easily and reliably. Since the electrical connection between the fine connecting portions and the fine connecting pads is made through the bumps of metal such as indium (In) or an alloy of indium, a resultant connection is reliable.

BRIEF DESCRIPTION OF THE DRAWINGS

FIGS. 1a and 1b are cross sections showing the steps of a conventional connecting method;

DESCRIPTION OF THE PREFERRED EMBODIMENTS

A first embodiment of the present invention is described with reference to a connection of a semiconductor chip and an LCD (liquid crystal display) substrate.

Figure 1A:
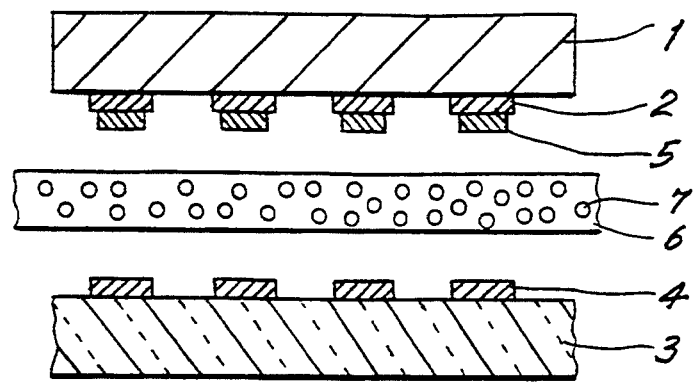
Figure 1A:
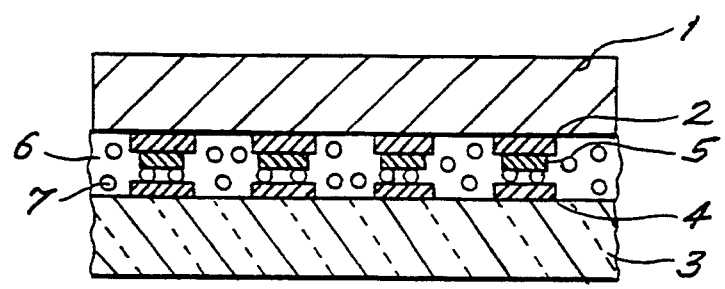
Figure 2A:
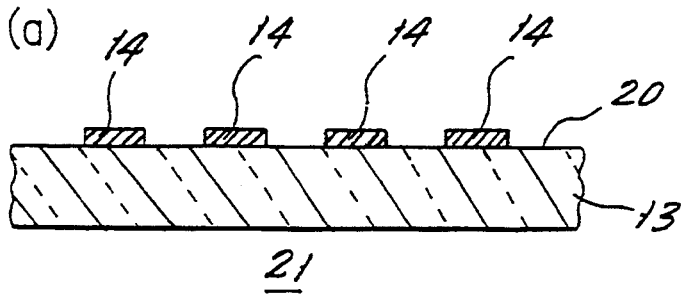
FIGS. 2a to 2f are cross sections showing the steps of a connecting method according to a first embodiment of the present invention.

As shown in FIG. 2a, an LCD substrate 21 comprising a glass substrate 13 having a major surface 20 on which a plurality of connecting portions 14 are formed is prepared first. The connecting portions 14 are portions of a wiring pattern formed on the major surface of the substrate 13 to act as terminals to be connected to connecting pads formed on an integrated circuit chip.

Figure 2B:
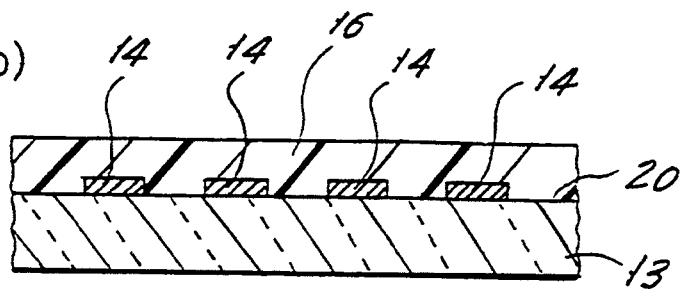

Then, as shown in FIG. 2b, the major surface 20 of the LCD substrate 21 including the connecting portions 14 is spin-coated with photothermosetting resin substantially uniformly. Next this substrate 21 is pre-baked at 90° C. for ten minutes, and a photothermosetting resin film 16 is formed. Constituents of this photothermosetting resin are shown below in weight ratio:

epoxy resin: acrylic acid, maleic acid or Triethylene Glycol Dimethacrylate: epoxyacrylate: benzophenone = 100:30 to 50:10:1 to 5.

The coating with this photothermosetting resin is performed by a spinner which is a spin coating device.

Figure 2C:
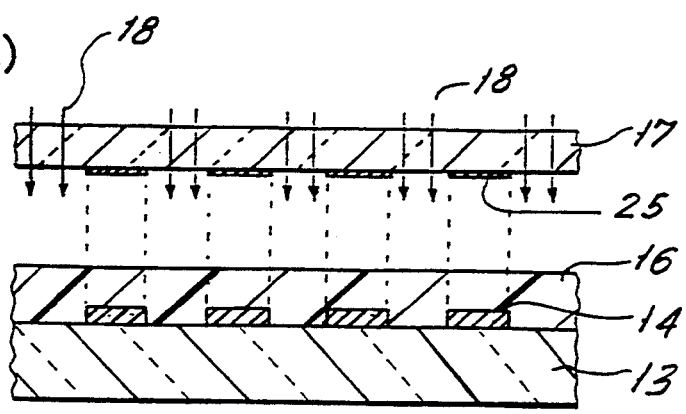

Thereafter, as shown in FIG. 2c, the photothermosetting resin film 16 is selectively exposed with ultraviolet rays 18 through a photo mask 17 having a chromium film 25 patterned to shield the rays to the connecting portions 14, by means of photolithography, so that the photothermosetting resin film 16 except for portions thereof corresponding to a connecting portions 14 is hardened to have the first hardness.

Figure 2D:
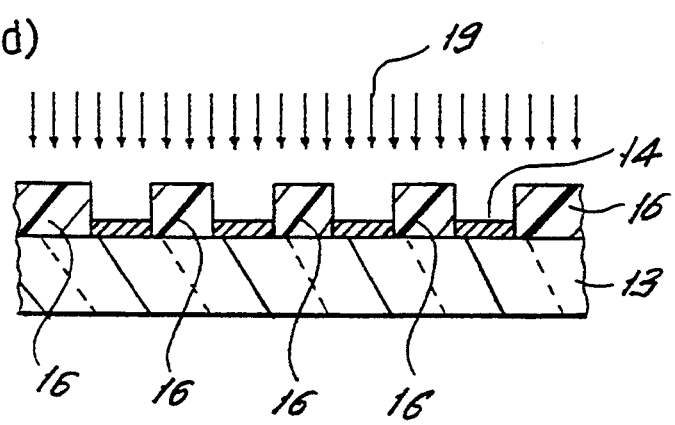

Then, as shown in FIG. 2d, the photothermosetting resin film 16 is developed with developer 19. Developer 19 is alkaline aqueous solution (aqueous solution of sodium carbonate or aqueous solution of calcium carbonate) or 1,1,1-Trichloroethane. With this development, the portions of the photothermosetting resin film 16 on the connecting portions 14 are selectively removed.

Figure 2E:
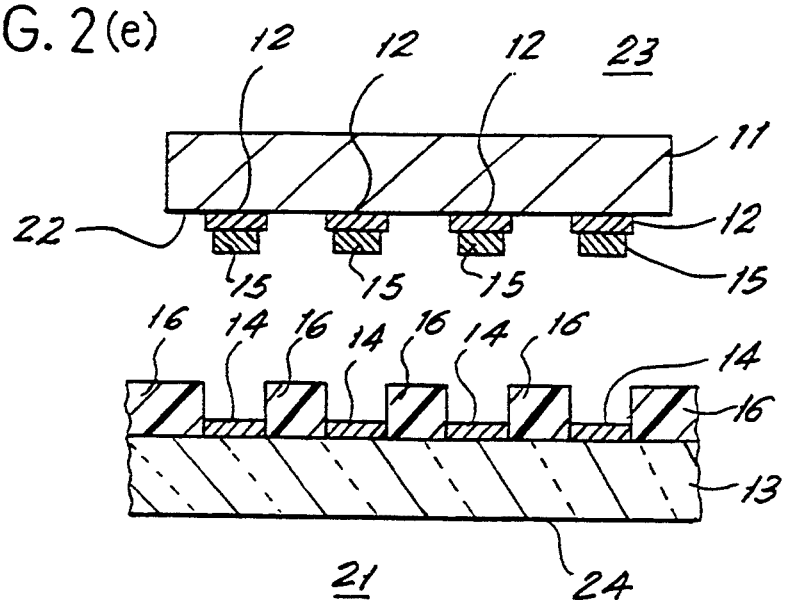

An integrated circuit chip 23 is, as shown in FIG. 2e, prepared by forming a plurality of connecting pads 12 on a major surface 22 of a semiconductor wafer 11 and forming metal bumps 15 on the respective connecting pads 12. The connecting pads 12 constitute a portion of a wiring pattern of an IC or LSI formed on the chip and are also usable as bonding pads. The metal bumps 15 are soft metal bumps such as sodium (In) or an alloy of indium and lead, which are elastically deformable easily.

The metal bumps 15 of the integrated circuit chip 23 and the connecting portions 14 of the LCD substrate 21 are disposed facing each other. This positioning can be done easily by visually checking the connecting portions 14 and the connecting pads 12 through an opposite surface 24 of the glass substrate 13 to the major surface 20 thereof since the glass substrate 13 and the photothermosetting resin film 16 are transparent or translucent.

Figure 2F:
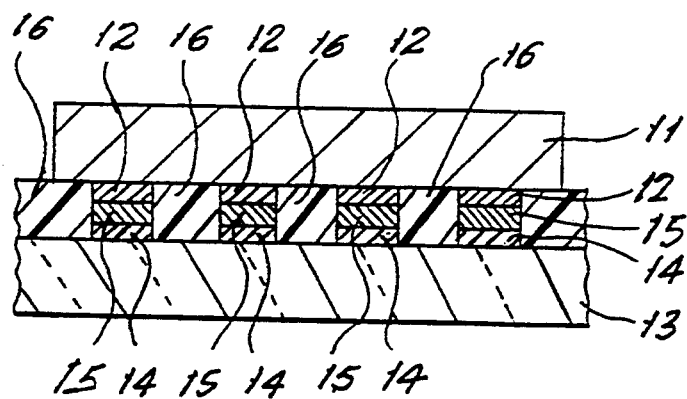

Then, as shown in FIG. 2f, the integrated circuit chip 23 and the LCD substrate 21 are mated to each other, keeping the registration between the metal bumps 15 of the chip and the connecting portions 14 of the substrate 21 and pressing same to each other with a load of, for example, 10 Kg/cm². With this load, the metal bumps 15 are elastically deformed to electrically connect the connecting portions 14 and the connecting pads 12 to each other. Keeping this relative position between portions 14 and pads 12, the photothermosetting resin film 16 is kept at 150° C. for 10 minutes to attain a second hardness which is harder than the first hardness. Thus, portions of the major surface of the integrated circuit chip 23 which have no connecting pads 12 are adhered to the LCD substrate 21 through the resin film 16 which functions as an adhesive.

A second embodiment of the present invention will be described with reference to FIGS. 3a to 3f which show the steps of connecting an LCD substrate to a semiconductor chip.

Figure 3A:
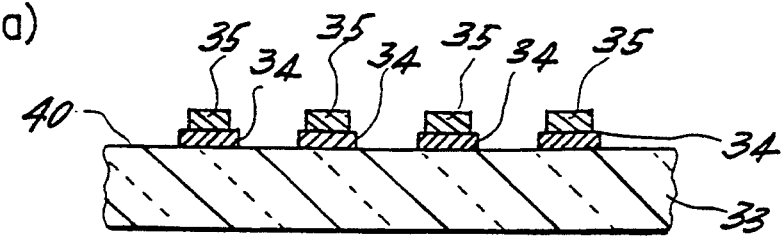
FIGS. 3a to 3f are cross sections showing the steps of a connecting method according to a second embodiment of the present invention.

First, as shown in FIG. 3a, an LCD substrate 41 is prepared by forming a plurality of connecting portions 34 on a major surface 40 of a glass substrate 33 and then forming metal bumps 35 on the respective connecting portions 34. These connecting portions 34 constitute portions of a wiring pattern and are used as terminals to be connected to connecting pads formed on an integrated circuit chip. The metal bumps 35 are soft metal bumps such as indium (In) or an alloy of indium and lead, which are elastically deformable easily.

Figure 3B:
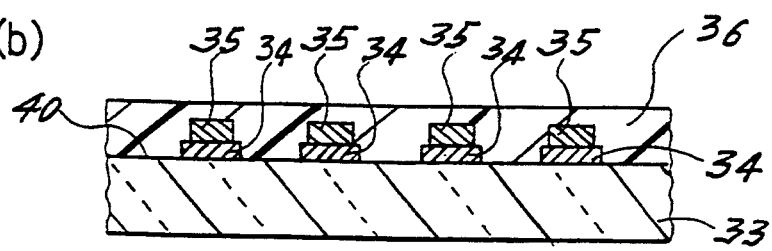

Then, as shown in FIG. 3b, the major surface 40 of the LCD substrate 41 including the metal bumps 35 is spin-coated with photothermosetting resin substantially uniformly. Next, the coated substrate 41 is pre-baked at 90° C. for 10 minutes, and a photothermosetting resin film 36 is formed. Constituents of this photothermosetting resin are shown below in weight ratio:

epoxy resin: acrylic acid or maleic acid or Triethylene Glycol Dimethacrylate: epoxyacrylate: benzophenone=100:30 to 50:10:1 to 5

The coating with this photothermosetting resin is performed by a spinner which is a spin coating device.

Figure 3C:
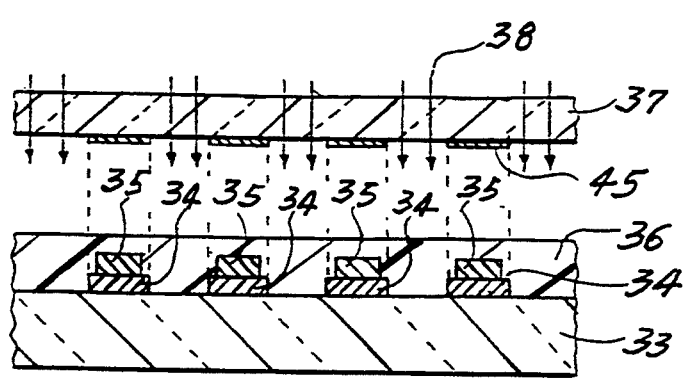

Thereafter, as shown in FIG. 3c, the photothermosetting resin film 36 is selectively exposed with ultraviolet rays 38 through a photo mask 37 having a chromium film 45 patterned to shield rays to the connecting portions 34, by means of photolithography, so that the photothermosetting resin film 36 except for portions thereof corresponding to a connecting portions 34 is hardened to have the first hardness.

Figure 3D:
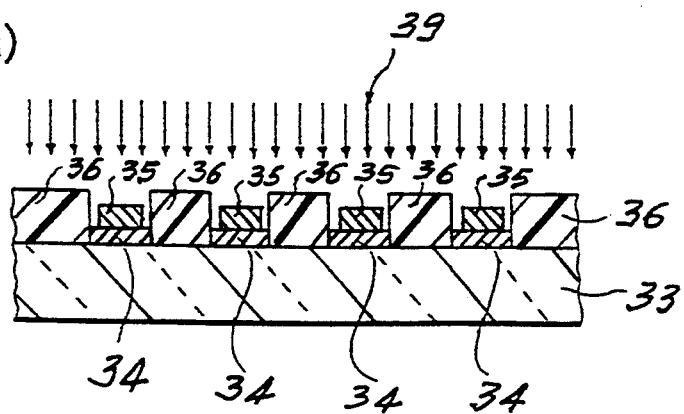
Figure 3:
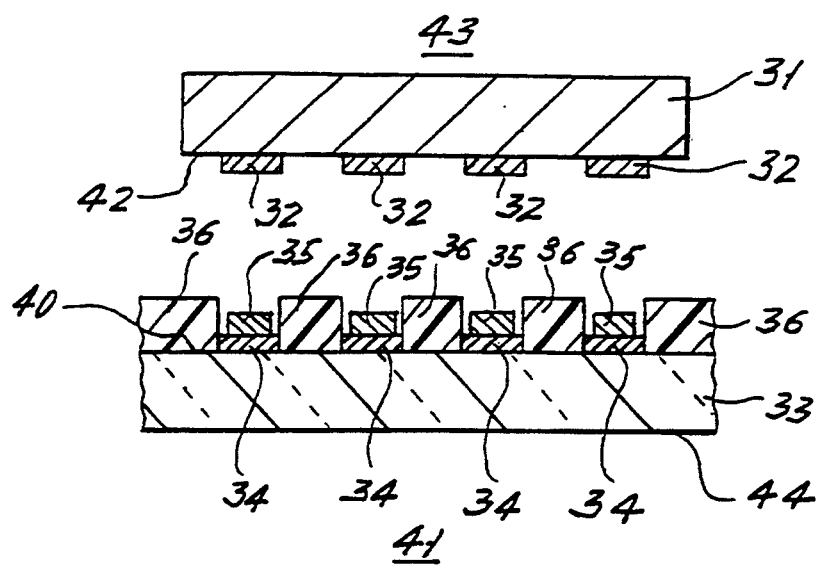

Then, as shown in FIG. 3d, the photothermosetting resin film 36 is developed with developer 39. Developer 39 is alkaline aqueous solution (aqueous solution of sodium carbonate or aqueous solution calcium carbonate) or 1,1,1-Trichloroethane. With this development, the portions of the photothermosetting resin film 36 on the connecting portions 34 are selectively removed.

An integrated circuit chip 43 is, as shown in FIG. 3e, prepared by forming a plurality of connecting pads 32 on a major surface 42 of a semiconductor substrate 31. The connecting pads 32 constitute a portion of a wiring pattern of an IC or LSI formed thereon and are also usable as bonding pads.

The connecting pads 32 of the integrated circuit chip 43 and the connecting portions 34 of the LCD substrate 41 are registered to each other. The registration can be done easily by visually checking the connecting portions 34 and the connecting pads 32 through an opposite surface 44 of the glass substrate 33 to the major surface 40 thereof since the glass substrate 33 and the photothermosetting resin film 36 are transparent or translucent.

Figure 3F:
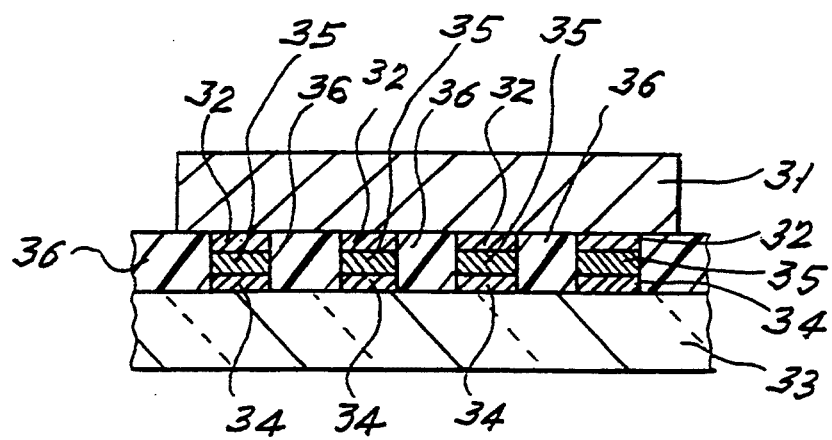

Then, as shown in FIG. 3f, the integrated circuit chip 43 and the LCD substrate 41 are mated while maintaining the registration between the connecting pads 32 of the chip and the metal bumps 35 of the substrate 41 and by pressing same to each other with a load of, for example, 10 Kg/cm². With this load, the metal bumps 35 are elastically deformed to electrically connect the connecting portions 34 and the connecting pads 32 to each other. The photothermosetting resin film 36 is kept at 150° C. for 10 minutes to attain a second hardness which is harder than the first hardness. The surface portions of the major surface of the integrated circuit chip 43 are adhered to the LCD substrate 41 through the resin film 36 acting as an adhesive.

It should be noted that the wiring substrate used as an object to be connected according to the present invention is not limited to only a substrate (glass or quartz) of a liquid crystal display panel and it may be a printed circuit board or a semiconductor wafer on which a wiring pattern is formed. Further, the present invention is applicable to any wiring substrate having any configuration so long as it has a portion having a flat surface on which a wiring pattern is formed. In order to perform a registration between a wiring substrate and a semiconductor chip when the wiring substrate is opaque, coordinates of connecting portions on the wiring substrate and coordinates of connecting pads of the integrated circuit chip are preliminarily measured from images of them obtained by a video camera, by using a pattern recognition technique. Then, a relative rotation angle of the connecting portions to the connecting pads is made null by rotating a robot hand fixedly supporting the chip. Thereafter, coordinates at which the connecting portions and the connecting pads can be registered are calculated and the robot hand is moved thereon while detecting a distance to the coordinates in submicron units by using a laser distance measuring system. Thereafter, the chip is pressed to the wiring substrate with a predetermined load in the same manner as mentioned previously for the case of an LCD.

Although the integrated circuit chip is usually one of a plurality of chips cut out from a semiconductor wafer, there is an exception when a single wafer bears a single semiconductor device. This invention is also applicable to a connection of such a single wafer to a wiring substrate.

This invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of connecting a semiconductor chip and a wiring substrate, comprising the steps of:
   coating a major surface of said wiring substrate together with a plurality of connecting portions formed on said major surface of said wiring substrate with a photothermosetting resin film;
   selectively removing said photothermosetting resin film by photolithography to form a plurality of holes therein wherein the resin film is removed in the holes, each of said holes exposing an associated one of said connecting portions;
   registering, in position, said wiring substrate and said semiconductor chip having a plurality of connecting pads and a plurality of metal bumps each formed on an associated one of said connecting pads such that each of said metal bumps of said semiconductor chip faces an associated one of said connecting portions of said wiring substrate; and
   heating, while maintaining each of said metal bumps and each of said connecting portions in contact with each other through an associated one of said holes, to connect said wiring substrate and said semiconductor chip with each other through said photothermosetting resin film and to connect said metal bumps of said semiconductor chip and said connecting portions of said wiring substrate respectively with one another.

2. The method of connecting a semiconductor chip and a wiring substrate as claimed in claim 1, wherein said metal bumps are of indium or an alloy thereof.

3. The method of connecting a semiconductor chip and a wiring substrate as claimed in claim 1, wherein said step of heating comprises adhering portions of said semiconductor chip not having said connecting pads and portions of the wiring substrate not having the connecting portions through said photothermosetting resin film functioning as an adhesive.

4. The method of connecting a semiconductor chip and a wiring substrate as claimed in claim 3, further comprising applying a predetermined load while performing said step of heating.

5. The method as claimed in claim 1, wherein said step of coating with a photothermosetting resin film comprises coating with an epoxy resin, one of acrylic acid, maleic acid and one of triethylene glycol dimethacrylate, epoxyacrylate, benzophenone.

6. The method as claimed in claim 5 wherein said step of coating with a photothermosetting resin film comprises coating with an epoxy resin, one of acrylic acid, maleic acid and one of triethylene glycol dimethacrylate, epoxyacrylate, benzophenone.

7. A method of connecting an integrated circuit chip and a wiring substrate, comprising the steps of:
   coating a major surface of said wiring substrate together with a plurality of metal bumps formed on respective connecting portions formed on said major surface of said wiring substrate with a photothermosetting resin film;
   selectively removing said photothermosetting resin film by photolithography to form a plurality of holes therein wherein the resin film is removed in the holes, each of said holes exposing an associated one of said metal bumps;
   registering, in position, said wiring substrate and said integrated circuit chip having a plurality of connecting pads formed on a major surface of said integrated circuit chip such that each of said metal bumps of said wiring substrate faces an associated one of said connecting pads of said integrated circuit chip; and
   heating, while maintaining each of said metal bumps and each of said connecting pads in contact with each other through an associated one of said holes, to connect said wiring substrate and said integrated circuit chip with each other through said photothermosetting resin film and to connect said connecting pads of said integrated circuit chip and said metal bumps of said wiring substrate respectively with one another.

8. The method of connecting an integrated circuit chip and a wiring substrate as claimed in claim 7, wherein said metal bumps are of indium or an alloy thereof.

9. The method of connecting an integrated circuit chip and a wiring substrate as claimed in claim 7, wherein said step of heating comprises adhering portions of said integrated circuit chip not having said connecting pads and portions of the wiring substrate not having the connecting portions through said photothermosetting resin film functioning as an adhesive.

10. The method of connecting an integrated circuit chip and a wiring substrate as claimed in claim 9, further comprising applying a predetermined load while performing said step of heating.

* * * * *